US006926288B2

(12) United States Patent
Bender

(10) Patent No.: US 6,926,288 B2
(45) Date of Patent: Aug. 9, 2005

(54) ELECTROMAGNETIC INTERFERENCE FILTER

(75) Inventor: Paul T. Bender, Northborough, MA (US)

(73) Assignee: Bose Corporation, Framingham, MA (US)

( * ) Notice: Subject to any disclaimer, the term of this patent is extended or adjusted under 35 U.S.C. 154(b) by 262 days.

(21) Appl. No.: 10/453,359

(22) Filed: Jun. 2, 2003

(65) Prior Publication Data

US 2004/0239055 A1 Dec. 2, 2004

(51) Int. Cl.[7] .............................................. B60G 17/015
(52) U.S. Cl. ...................... 280/5.507; 188/267; 310/23
(58) Field of Search ............................... 280/5.5, 5.507, 280/5.508, 5.513, 5.514; 267/64.16; 188/267; 310/15, 17, 23

(56) References Cited

U.S. PATENT DOCUMENTS

| | | | |
|---|---|---|---|
| 3,687,483 A | 8/1972 | Gull et al. | |
| 4,494,074 A | 1/1985 | Bose | |
| 4,892,328 A | 1/1990 | Kurtzman et al. | |
| 4,909,536 A | * 3/1990 | Hale | 280/6.157 |
| 4,960,290 A | 10/1990 | Bose | |
| 4,969,662 A | 11/1990 | Stuart | |
| 4,981,309 A | 1/1991 | Froeschle et al. | |
| 4,991,698 A | 2/1991 | Hanson | |
| 5,028,073 A | 7/1991 | Harms et al. | |
| 5,060,959 A | 10/1991 | Davis et al. | |
| 5,216,723 A | 6/1993 | Froeschle et al. | |
| 5,293,969 A | * 3/1994 | Yamaoka et al. | 188/266.5 |
| 5,309,050 A | 5/1994 | Morinigo et al. | |
| 5,341,054 A | 8/1994 | Tal et al. | |
| 5,441,298 A | 8/1995 | Miller et al. | |
| 5,574,445 A | 11/1996 | Maresca et al. | |
| 5,701,039 A | 12/1997 | Parison et al. | |
| 5,706,196 A | * 1/1998 | Romstadt | 701/37 |
| 6,000,702 A | 12/1999 | Streiter | |
| 2003/0034697 A1 | 2/2003 | Goldner et al. | |

FOREIGN PATENT DOCUMENTS

| | | |
|---|---|---|
| DE | 91 03 304.7 U | 7/1991 |
| EP | 0 415 780 A1 | 3/1991 |

* cited by examiner

Primary Examiner—David R. Dunn
(74) Attorney, Agent, or Firm—Fish & Richardson P.C.

(57) ABSTRACT

An electromechanical actuator in a vehicle suspension system includes a housing having a first section adapted to affix to a vehicle body and a second section adapted to affix to a vehicle wheel assembly suspended to the vehicle body, the first and second sections coupled to form a motor, electronics including a power-switching devices disposed within a chamber of the housing and adapted to receive electrical power and to direct power to the motor, and a filter board including capacitors and inductors disposed within the chamber to suppress noise generated by the power-switching devices to an external DC power source.

93 Claims, 8 Drawing Sheets

ELECTROMAGNETIC INTERFERENCE FILTER

TECHNICAL FIELD

This invention relates to an electromagnetic interference (EMI) filter.

BACKGROUND

Active automotive suspensions can include electrically powered actuators. In an active suspension system, power is supplied to the suspension, such as to help control vertical accelerations of a sprung mass when an unsprung mass encounters road disturbances. Integrating power electronics within an actuator can result in unacceptable levels of conducted electromagnetic interference (EMI).

SUMMARY

In one aspect, the invention features an electromechanical actuator including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board including capacitors and inductors disposed within the chamber to suppress electromagnetic emissions generated by the power-switching devices conducted to an external DC power source.

One or more of the following advantageous features can also be included. The motor can be a linear or rotary motor. The power-switching devices can be single-phase or multi-phase switching devices. The suppressed noise can be conducted emissions. The chamber can reduce radiated emissions from the power-switching devices. The DC power source can provide power which meets a variety of specifications such as having average voltage substantially equal to 325 volts, or greater than 12 volts, or greater than 42 volts, or greater than 118 volts, having peak current greater than 75 amps or substantially 100 amps, or having peak power substantially equal to or greater than 30 KW. The filter board can be designed to fit within a package having a predetermined volume, which can be less than 2,100,000 cubic millimeters. The capacitors can be non-electrolytic capacitors (ceramic and DC Film type) such as disk ceramics, monolithic/multilayer ceramics, polyester film, polycarbonate film, polypropylene film and metalized films, and so forth. The filter board can distribute capacitance while keeping line transients to a minimum.

In embodiments, the filter board can have an output impedance less than 1 ohm for frequencies within a 0 Hz to 2 kHz range. The filter board can have an output impedance less than 1 ohm for frequency within a 15 kHz to 5 MHz range.

In another aspect, the invention features an electromechanical actuator system including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board disposed within the chamber, the filter board including a multi-section ladder filter with dampening resistance designed for a package having a predetermined volume.

One or more of the following advantageous features can also be included. The motor can be a linear or rotary motor. The power-switching devices can be single-phase or multi-phase switching devices. The multi-section ladder filter can include capacitors and inductors. The multi-section ladder filter can include a dampening mechanism. The dampening mechanism can parallelly connect a resistance to at least one of the inductors. The dampening mechanism can serially connect a resistance to at least one of the capacitors. The multi-section ladder filter can include a dominant inductance serially connected to the power supply line. The dampening mechanism can parallelly connect a resistance to the dominant inductance to damp inductor-capacitor resonances that occur between the line inductance and a supply decoupling capacitance to protect the switching power devices and reduce the conducted and radiated EMI emissions. The dampening mechanism can also parallelly connect a link composed of a dampening resistance serially connected to a dampening capacitor, in parallel to at least one of the capacitors of the multi-section ladder filter.

In another aspect, the invention features an electromechanical actuator including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board disposed within the chamber and positioned between the power-switching devices and an external DC power source, the filter board cutoff frequency designed to facilitate the power-switching devices to switch at a predetermined switching frequency.

One or more of the following advantageous features can also be included. The motor can be a linear or rotary motor. The power-switching devices can be single-phase or multi-phase switching devices. The filter board can include capacitors and inductors. The predetermined switching frequency can be greater than audible frequencies such as 15 kilohertz (kHz). The capacitors and inductors can provide a predetermined attenuation to the power-switching devices output signals (and to the external DC power source signals) having frequency components greater than 520 kHz. The predetermined attenuation can be at least 120 decibels (dB).

In another aspect, the invention features an electromechanical actuator including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board disposed within the chamber and positioned between the power-switching devices and an external DC power source, the filter board designed to have specific vibration tolerance characteristics.

One or more of the following advantageous features can also be included. The motor can be a linear or rotary motor. The power-switching devices can be single-phase or multi-phase switching devices. The filter board can include capacitors and inductors. The vibration tolerance characteristics can follow Society of Automotive Engineers (SAE) J1211 recommendations.

In embodiments, the capacitors can be non-electrolytic capacitors (ceramic and DC Film type) such as disk ceramics, monolithic/multilayer ceramics, polyester film, polycarbonate film, polypropylene film and metalized films, and so forth. The filter board can distribute capacitance while keeping line transients to a minimum.

In another aspect, the invention features an electromechanical actuator including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board disposed within the chamber and positioned between the power-switching devices and an external DC power source, the filter board designed to meet specific EMI emissions specifications.

One or more of the following advantageous features can also be included. The motor can be a linear or rotary motor. The power-switching devices can be single-phase or multi-phase switching devices. The filter board can include capacitors and inductors. The specific EMI emissions specifications can be defined in Society of Automotive Engineers (SAE) J551 and J1113.

In embodiments, the capacitors can be non-electrolytic capacitors (ceramic and DC Film type) such as disk ceramics, monolithic/multilayer ceramics, polyester film, polycarbonate film, polypropylene film and metalized films, and so forth. The filter board can distribute capacitance while keeping line transients to a minimum.

In another aspect, the invention features an electromechanical actuator including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board with a power density of at least 0.0143 watts/cubic millimeter disposed within the chamber to suppress noise generated by the power-switching devices to an external DC power source.

One or more of the following advantageous features can also be included. The motor can be a linear or rotary motor. The power-switching devices can be single-phase or multi-phase switching devices. The suppressed noise can be conducted emissions. The filter board can include capacitors and inductors designed to fit within a package having a predetermined volume. The capacitors can be non-electrolytic capacitors (ceramic and DC Film type) such as disk ceramics, monolithic/multilayer ceramics, polyester film, polycarbonate film, polypropylene film and metalized films, and so forth. The filter board can distribute capacitance while keeping line transients to a minimum.

In another aspect, the invention features an electromechanical actuator including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board having a mass density substantially 0.0000007 kg per cubic millimeter disposed within the chamber to suppress noise generated by the power-switching devices to an external DC power source.

One or more of the following advantageous features can also be included. The motor can be a linear or rotary motor. The power-switching devices can be single-phase or multi-phase switching devices. The suppressed noise can be conducted emissions. The filter board can include capacitors and inductors designed to fit within a package having a predetermined volume. The capacitors can be non-electrolytic capacitors (ceramic and DC Film type) such as disk ceramics, monolithic/multilayer ceramics, polyester film, polycarbonate film, polypropylene film and metalized films, and so forth. The filter board can distribute capacitance while keeping line transients to a minimum.

In another aspect, the invention features an electromechanical actuator including, in a vehicle suspension system, a housing having a first section adapted to affix to a vehicle body and a second section adapted to affix to a vehicle wheel assembly suspended to the vehicle body, the first and second sections coupled to form a motor, electronics including power-switching devices disposed within a chamber of the housing and adapted to receive electrical power and to direct power to the motor, and a filter board disposed within the chamber, the filter board comprising a large inductor positioned between the external power supply and the power-switching devices by the power supply line.

One or more of the following advantageous features can also be included. The motor can be a linear or rotary motor. The power-switching devices can be single-phase or multi-phase switching devices. The large inductor can have dominant inductance relative to the power supply line. The large inductor can minimize the negative effects of the power line inductance to allow the power-switching devices to be located freely within the actuator.

Embodiments of the invention can have one or more of the following advantages.

A filter board, including capacitors and inductors, disposed within a chamber of an electromechanical actuator of an active vehicle suspension system, suppresses noise generated by power-switching devices to an external DC power source.

A filter board is disposed within a chamber of an electromechanical actuator in an active vehicle suspension system and is designed as a multi-section ladder filter with dampening resistance for a package having a predetermined volume.

A filter board is disposed within a chamber of an electromechanical actuator in an active vehicle suspension system and positioned between power-switching devices and an external DC power source, the filter board cutoff frequency is designed to facilitate the power-switching devices to switch at a predetermined switching frequency.

A filter board is disposed within a chamber of an electromechanical actuator in an active vehicle suspension system that follows specific vibration tolerance recommendations.

The filter board is designed to a specific power density for the power electronics within the active vehicle suspension system.

The filter board facilitates the integration of power electronics into an actuator. By doing so, besides cost and size benefits due to small packaging, switching phase currents are contained in a housing and travel along much shorter cables, thus reducing radiated EMI emissions.

The high order multi-section ladder EMI filter reduces the capacitance requirements and further facilitates packaging by allowing distribution of the capacitance while keeping line transients to a minimum and therefore minimizing conducted and radiated EMI emissions.

The details of one or more embodiments of the invention are set forth in the accompanying drawings and the description below. Other features, objects, and advantages of the invention will be apparent from the description and drawings, and from the claims.

DETAILED DESCRIPTION

In an active electromechanical suspension system, power is supplied to an electromechanical suspension to help control vertical accelerations of the sprung mass when the unsprung mass encounters road disturbances. The shock absorber of a common suspension can be replaced by a controlled force actuator that responds according to commands from a control system. The actuator can be electrically powered. High electrical current requirements for supplying the necessary power to an active vehicle suspension system can generate undesirable electromagnetic interference (EMI) that can interfere with radio reception and electrical devices in the vehicle. Further, packaging of an electrical actuator capable of developing the forces and speeds required to perform adequately as an active suspension actuator in the space available can be difficult.

Figure 1:
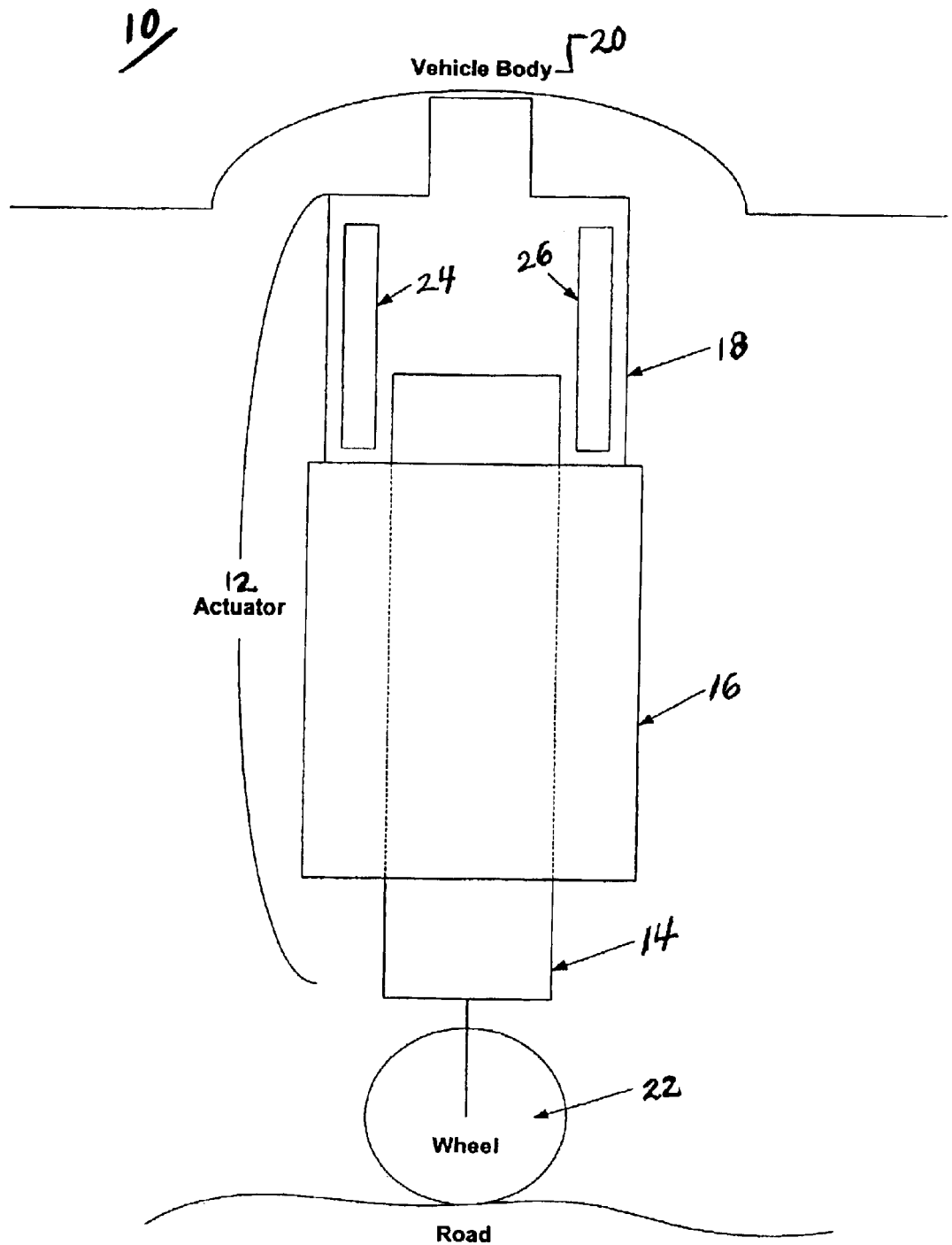
FIG. 1 is a block diagram of a system.

In FIG. 1, a system 10 includes active vehicle suspension actuator 12. The actuator 12 includes an armature 14 slidable with respect to a stator 16. In this example, a linear motor configuration is utilized, but it should be understood that other types of motor configurations, such as a rotary motor, are also applicable. Stator 16 is attachable to an end of a top cap 18, which is a metallic housing that defines an internal cavity and can have, for example, an oval cross section. Top cap 18 further affixes to a vehicle body 20. Armature 14, which affixes to a wheel assembly 22, travels through this internal cavity as the armature 14 moves relative to the stator 16.

Housed within the top cap 18 are on-board power electronics 24 and a filter board 26. More specifically, power electronics 24 and filter board 26 are attached to top cap 18 and positioned inside top cap 18 in cavities defined by top cap 18 and armature 14 such that the power electronics 24 and filter board 26 do not interfere with armature 14 moving relative to stator 16. The actuator 14 includes an electronic motor (armature 14 and stator 16) that converts electrical energy into mechanical work. The linear electronic motor, with appropriate communication controls, provides a controllable force between the wheel assembly 22 and the vehicle body 20. Any variation in force that is desired can be produced by correspondingly varying a control signal. There are a variety of possible implementations for armature 14 and stator 16 such as those described in U.S. Pat. No. 5,574,445 (Maresca et al.) for a linear motor, incorporated herein by reference in its entirety.

Figure 2:
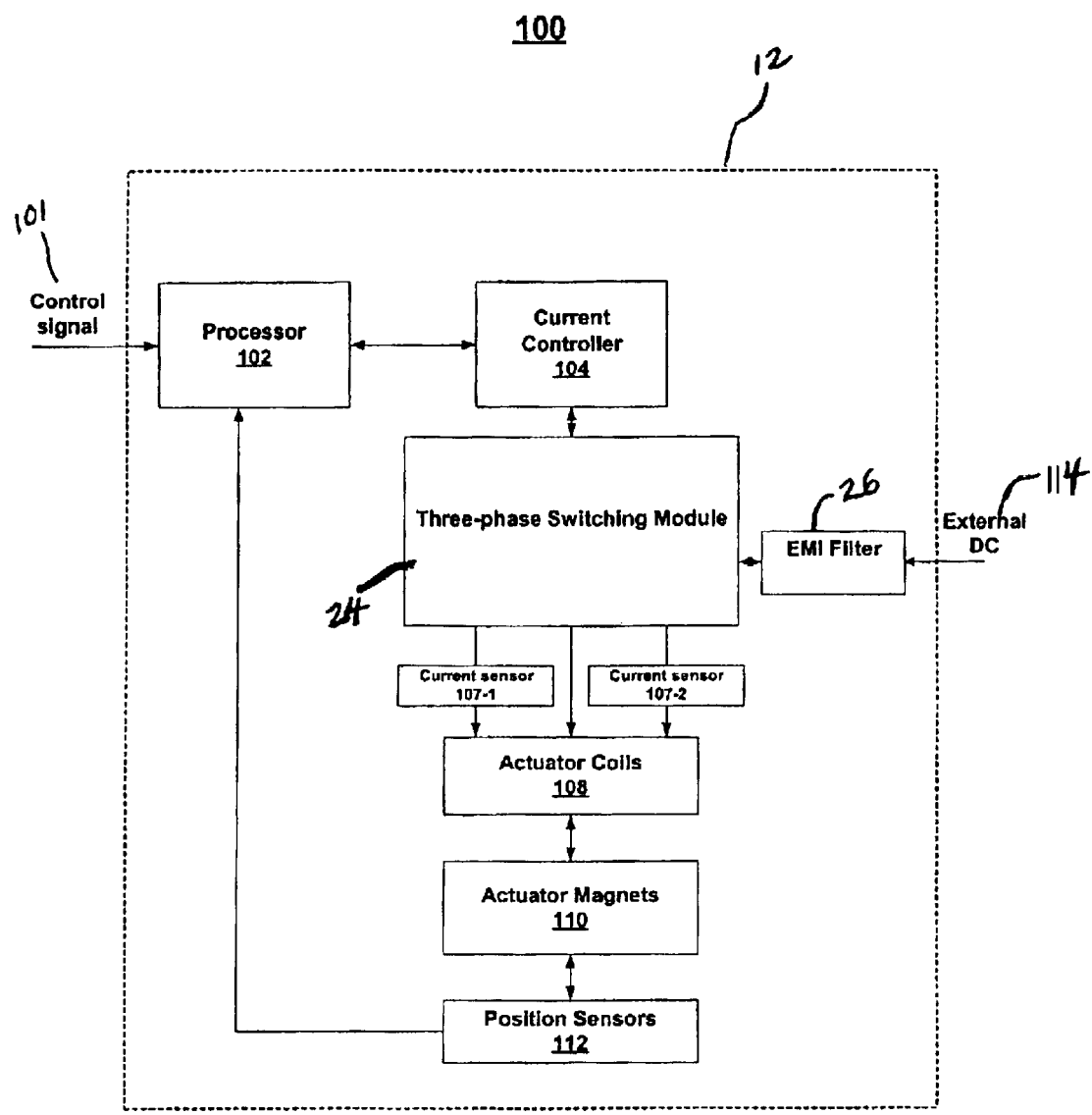
FIG. 2 is a function diagram of the actuator of FIG. 1.

In FIG. 2, a function block diagram 100 of the actuator 12 having integrated power electronics 24 and EMI (Electromagnetic Interference) filter board 26 is shown. A control signal 101, such as an external analog or digital command signal from a central controller as shown or an internal control signal from the actuator 14 (not shown), is utilized to command the integrated actuator 12 to generate electrically controllable force between the sprung and unsprung masses.

Active suspension actuator 12 is electrically controlled by a processor 102. Using a current controller 104, the processor 102 commands single-phase or multiple-phase power-switching electronics 24. The current controller 104 controls the phase currents that excite the linear motor (shown as actuator coils 108). For the illustrated three-phase power-switching electronics 24, a basic function of the current controller 104 is to close a feedback loop in current for two of the phases and constrain the voltage of the third phase so that the internal neutral remains near zero voltage. The three-phase power-switching electronics 24 can be, for example, a BSM 150 GD 18 DLC manufactured by Eupec Corporation. The power electronics 24 contains power-switching devices that apply voltage to the actuator coils. Although the description below uses a three-phase power-switching module as an example, is not restricted to only three-phase power-switching modules and three-phase actuator topologies. It is applicable to single-phase or other multiple-phase power-switching modules and devices as well as other single-phase or multi-phase actuator topologies.

The actuator 12 includes multiple permanent magnets 110 (mounted on armature 14). The moving field is produced by the stator's 16 stationary windings (shown as actuator coils 108), whose three phases are commutated in the proper sequence. This sequence is governed by the position/velocity/acceleration of the magnets 110. This information is provided by the position sensor 112.

The functions of processor 102 and current controller 104 include deriving the proper switching logic sequence and commutation for the power-switching devices contained in power-switching module 24. Ultimately the processor 102 provides a controllable force with respect to the position/velocity/acceleration of the actuator magnets 110 within its range of operation by providing current commands to the current controller 104, which further controls the three-phase switching module 24 that creates individual phase currents to drive actuator coils 108. The current sensors 107-1 and 107-2 are used to monitor the currents. The stator 16 (shown as actuator coils 108) interacts with armature 14 (shown as actuator magnets 110) to provide the desired force. To reduce radiated and conducted electromagnetic (EMI) emissions and to facilitate packaging of the power electronics 24 into the actuator 12, the EMI filter board 26 is used between the external DC power line 114 and the power-switching module 24.

Actuator 14 uses power whenever it generates force. The power is provided by one or more power sources including a generator, which can be used to provide power when actuator 14 operates under a low power condition. Additionally, a battery system and one or more energy storage devices, such as capacitors, can provide additional power when the actuator 14 operates under conditions that require higher power. The external power source can provide power which meets a variety of specifications, such as having average voltage substantially equal to 325 volts, or greater than 12 volts, or greater than 42 volts, or greater than 118 volts or having peak current greater than 75 amps or substantially 100 amps, or having peak power substantially equal to or greater than 30 KW, depending on the specific application requirements and power electronics 24 implementations.

Traditionally, a high-value capacitor, C, is used as a filter between the power supply 114 and the power-switching devices 24. Capacitor values on the order of several thousand microfarads are typical. Since the power supply line 114 has some parasitic inductance, L, the high-value capacitor reduces the L-C resonance seen by the power-switching devices 24 and attenuates conducted EMI emissions. However, using a high-valued capacitor is problematic for at least two reasons. First, high-value, high-voltage capacitors are physically large. Therefore, it can be difficult, or impossible, to package the capacitor into the volume available in the actuator housing. Second, high-value capacitors are typically electrolytic-type, which have limited environmental capability, especially with respect to the vibration and temperature extremes required in an automotive application.

Figure 3:
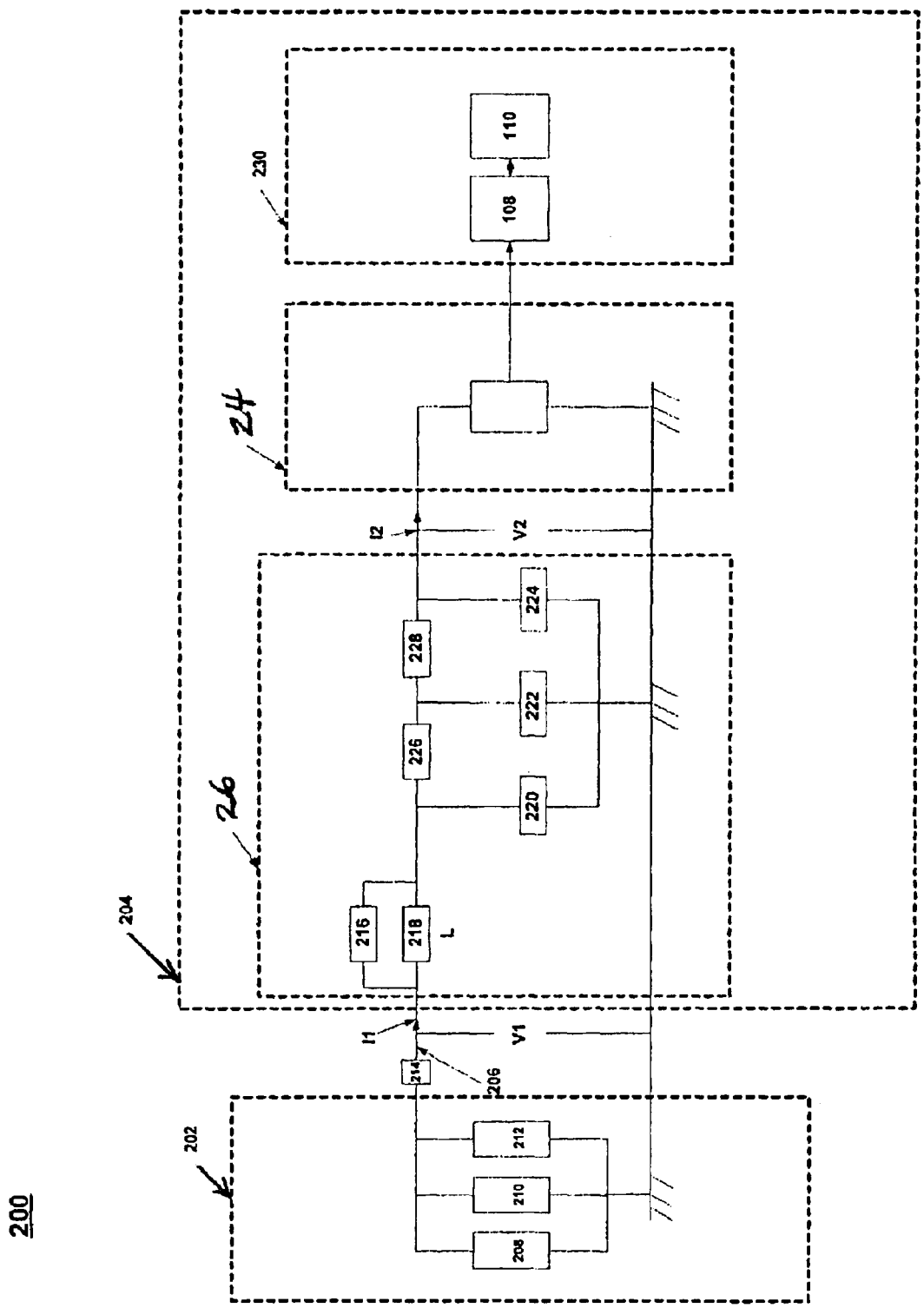
FIG. 3 is a block diagram of the exemplary filter board of FIG. 2.

In FIG. 3, a schematic diagram 200 of the filter board 26 is shown. A power source 202 provides power to an integrated actuator 204 via power line wire 206. The power source 202 can include a generator 208, a battery system 210, and one or more capacitors 212. The cable wire 206 has line inductance value L-wire 214. The filter board 26 is designed to meet a variety of specifications and constraints as described below.

The filter board 26 should provide a low impedance source (defined as: $Z=(V1-V2)/I2$, as labeled in FIG. 3, to the power-switching module 24. A low impedance from the filter board 26 ensures that a substantial amount of the power transferred through the filter board 26 is delivered to the switching modules 24 and not dissipated in the filter 26 itself.

Depending on the specific application, the power-switching module 24, which commands the motor 230, can be designed to operate at different switching frequencies. For example, it can be desirable to switch at frequencies above the audible range, such as 15 to 20 KHz.

The filter board 26 reduces the conducted EMI emissions generated by the power-switching module 24 that are transmitted back onto the external power line 206. The intensity of the EMI emissions is regulated by government agencies in many countries to prevent interference with other equipment. For an automotive application environment, SAE (Society of Automotive Engineers) EMC (Electromagnetic Compatibility) standards, such as SAE J551 and J1113, provide EMI specifications. By physically locating the power electronics 24 near the actuator coils 108 and within a metal actuator housing, the radiated EMI emissions from the actuator 14 are also reduced.

The filter board 26 also should suppress power supply transients entering from the power line 206 from affecting the power-switching module 24. Without proper filtering, such transients can cause the power-switching module 24 to fail.

The filter board 26 and power electronics 24 combination should fit into the available space inside the actuator housing. For the exemplary actuator design as shown in FIG. 2, the space available inside the actuator housing for packaging board and power electronics combination can be less than 2,100,000 cubic millimeters (cm). The power density defined as peak power per cubic millimeter for the exemplary actuator with integrated filter board 26 and power electronics 24 is at least 0.0143 watts/cubic millimeter (30 KW/2100000 cubic millimeters). The mass density defined as kilograms of electronics per cubic millimeter is substantially 0.0000007 kg per cubic millimeter (1.5 kg mass/2100000 cubic millimeters).

To meet a variety of design specifications and constraints, as shown in FIG. 3, a multi-stage L-C (i.e., inductor-capacitor) filter ladder with damping resistor 216 is used. Since a single L-C section provides a second-order low pass filter effect, a higher-order multi-section ladder filter created by cascading several L-C sections together achieves significant attenuation (isolation) at the frequencies of interest. Thus, a conducted EMI emissions design requirement can be met. The order of a filter is the number of poles in the transfer function, which can be estimated from the number of reactive elements (capacitors and inductors) the filter contains.

The first stage of the filter 26 has a dominant inductor 218 (whose value is large relative to the power line inductance value L-wire 214) and a capacitor 220. A damping resistor 216 is parallel-connected to the dominant inductor 218. The remaining two stages include an inductor (226 for stage 2 and 228 for stage 3) and a capacitor (222 for stage 2 and 224 for stage 3). There are several advantages to this design.

The use of dominant inductor 218 in the first stage serves to minimize the sensitivity of the EMI filter 26 to power line inductance L-wire 214. Minimizing the sensitivity to power line inductance allows the actuator to be located remotely from power supply 202 and eases the design constraint of power supply line length.

The use of several large-valued inductors (218, 226, and 228) allows the design requirements to be met using a small amount of capacitance. Because only a small amount of capacitance is required, the physical space required by the capacitors is small. In turn, this makes the packaging of the power electronics 24 and filter board 26 into the actuator housing easier. In addition, the total capacitance is broken into three separate pieces, allowing the capacitance to more easily be physically distributed throughout the actuator housing. Because less capacitance is required, this design facilitates the utilization of smaller and more environmentally robust components (e.g., capacitors having better vibration and temperature tolerance as those recommended in SAE J1211 in an automotive application).

The use of a damping resistor 216 serves to reduce resonances in the filter 26. A typical L-C section is an under-damped resonant circuit, which can lead to transient peaking at the power-switching module 24. These transients can damage the power-switching module 24, which makes damping necessary. Damping resistor 216 serves to damp these resonances, which causes conducted and radiated EMI emissions from the power electronics 24 and filter board 26 to be reduced. In addition, damping resistor 216 ensures that no damaging transients are presented to the power-switching module.

Figure 4:
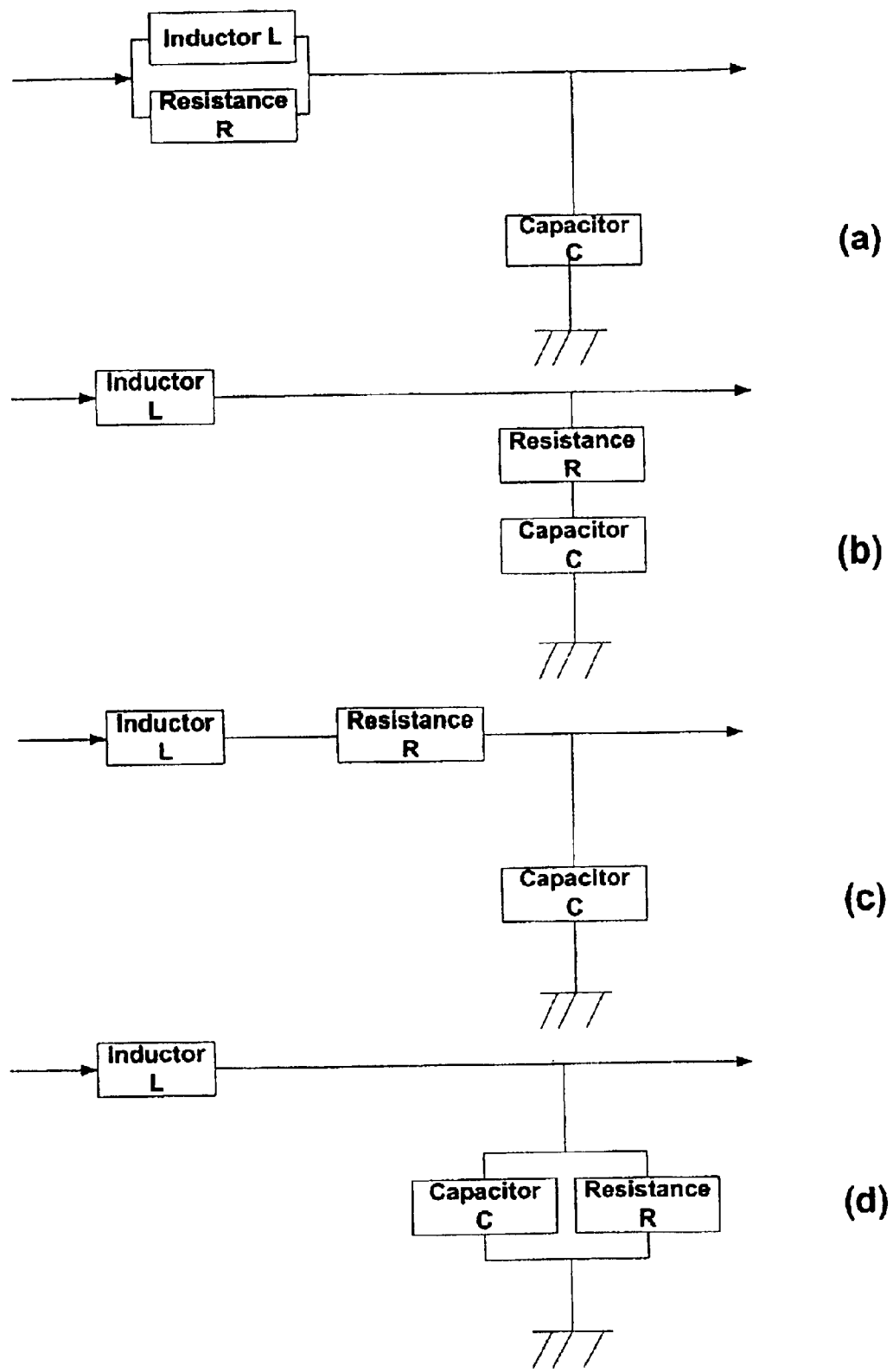
FIG. 4 is a series of block diagrams showing a dampening resistor.

There are several ways for providing damping for a typical L-C section. In FIG. 4, (a) shows a damping resistor R parallel-connected to the inductor L, (b) shows a damping resistor R series-connected to the capacitor C. Other choices that can not be as efficient as (a) and (b) are shown in (c) where a damping resistor R is series-connected to the inductor L and (d) where a damping resistor R is parallel-connected to the capacitor C. As shown in FIG. 3, a damping resistance 216 is parallel-connected to the dominant inductor 218. As discussed above, many other ways of providing damping can be implemented, such as to series or parallel-connect resistance to the inductors 226 or 228, or to series or parallel-connect resistance to the capacitors 220, 222 and 224. The dampening resistance can also be serially connected to a dampening capacitor to construct a link, the link further parallelly connected to at least one of the capacitors of the multi-section ladder filter. For this design, the capacitance of the dampening capacitor is smaller than the capacitance of the capacitors of the multi-section ladder filter.

Although circuit 26 shows three inductors 218, 226, 228 and three capacitors 220, 222, 224, depending on system requirements, there can be more or less inductors and capacitors used. Thus, the order of the filter board 26 can be different. The combinations of the configurations discussed above in FIG. 4 can also be used to provide damping.

Figure 5A:
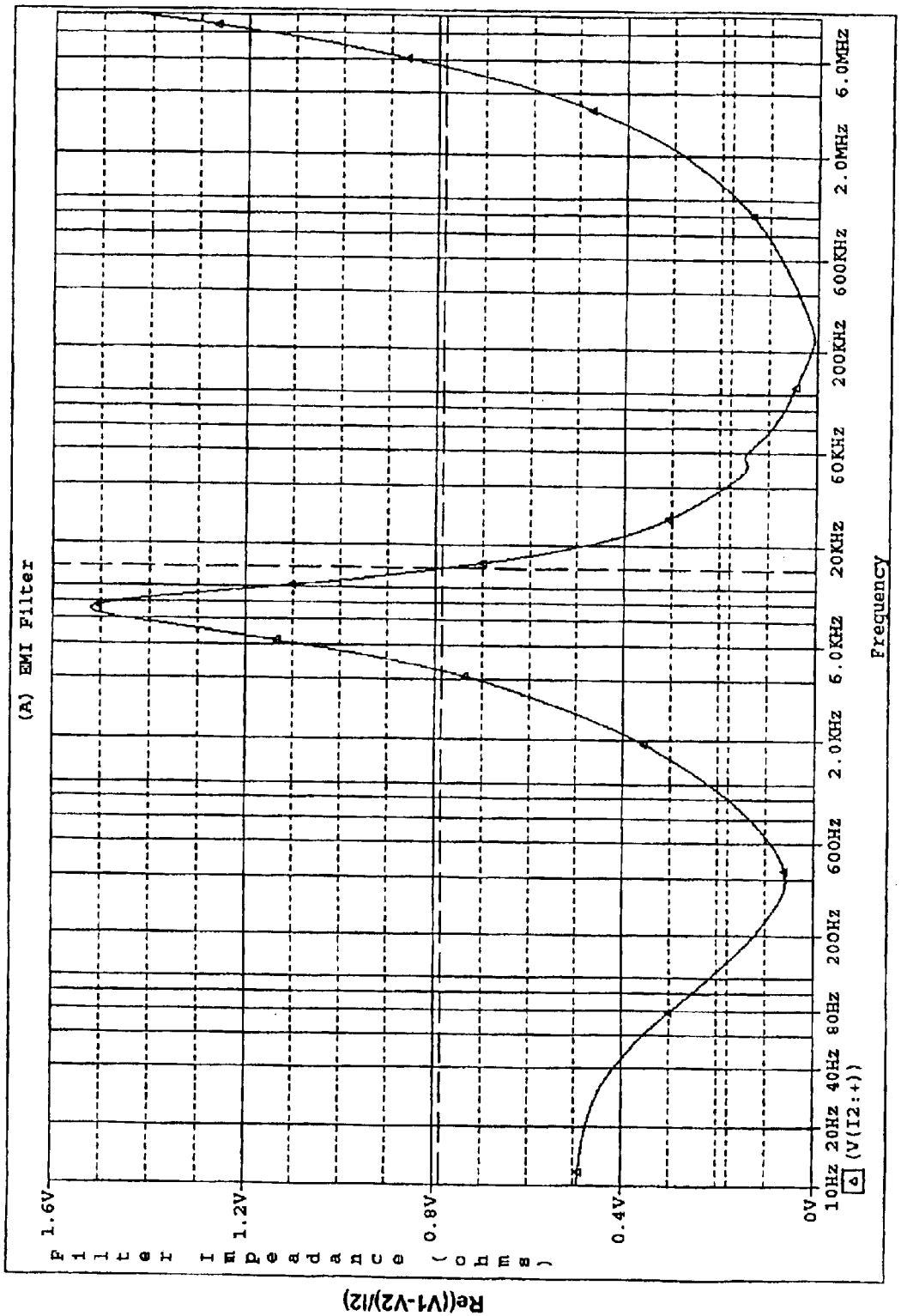
FIG. 5(a) is the real part of the output impedance of the exemplary filter board.
Figure 5B:
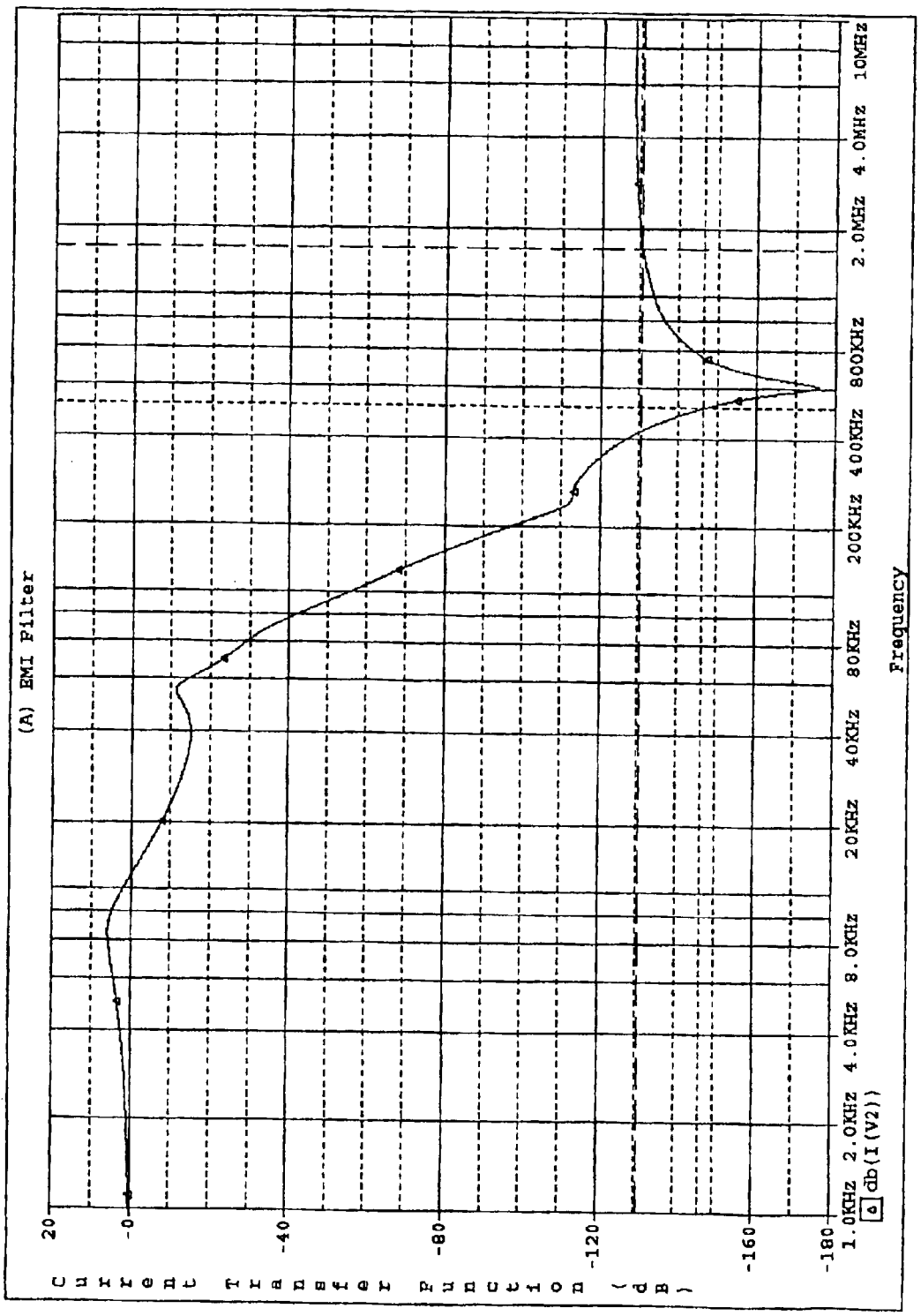
FIG. 5(b) is the magnitude of the current transfer function (frequency response) of the exemplary filter board.

In FIG. 5(a) and FIG. 5(b) an exemplary multi-section filter board 26 design is shown. The multi-section filter board 26 can be designed to meet a variety of specifications such as the attenuation for certain frequency ranges, cutoff frequencies, output impedance, damping function, and so forth, by properly choosing the design parameters such as the number of stages (the order of the filter board) and the values of the components (capacitors, inductors, resistors). Specifically, the inductor and capacitor values can be chosen such that the conducted EMI emissions meet the design specification as those defined in SAE J551 and J1113 and vibration tolerance characteristics follow those recommended in SAE J1211. Similarly, the inductor, capacitor, and resistor values can be chosen such that the output impedance of the filter is suitable for the power-switching module.

FIG. 5(a) is the real part of the output impedance of the exemplary filter board (Re((V1−V2)/I2)) (as in FIG. 3), and FIG. 5(b) is the magnitude of the current transfer function (frequency response) of the exemplary filter board (|I2/I1| as in FIG. 3). More specifically, as shown in FIG. 5(b), certain high frequency ranges, such as those greater than 400 kHz, get a specific amount of attenuation, such as greater than 120 dB.

The output impedance of the filter board 26 is kept low to avoid unnecessary loss. In the example shown in FIG. 5(a), a set of design specifications for the output impedance of the filter board 26 is such that the output impedance of the filter board 26 is less than 1 ohm during certain frequency ranges, such as for frequencies between 0 and 2 KHz and between 15 kHz and 5 MHz. This ensures that the filter 26 provides a low impedance source at those frequencies where significant power is delivered and at the switching frequency (and harmonics).

The actual inductors used to implement the filter 26 can be realized using combinations of series and parallel-connected inductors. Similarly, the actual capacitors used to implement the filter 26 can be realized using combinations of series and parallel-connected capacitors. Likewise, the actual resistors used to implement the filter 26 can be realized using combinations of series and parallel-connected resistors.

Figure 6:
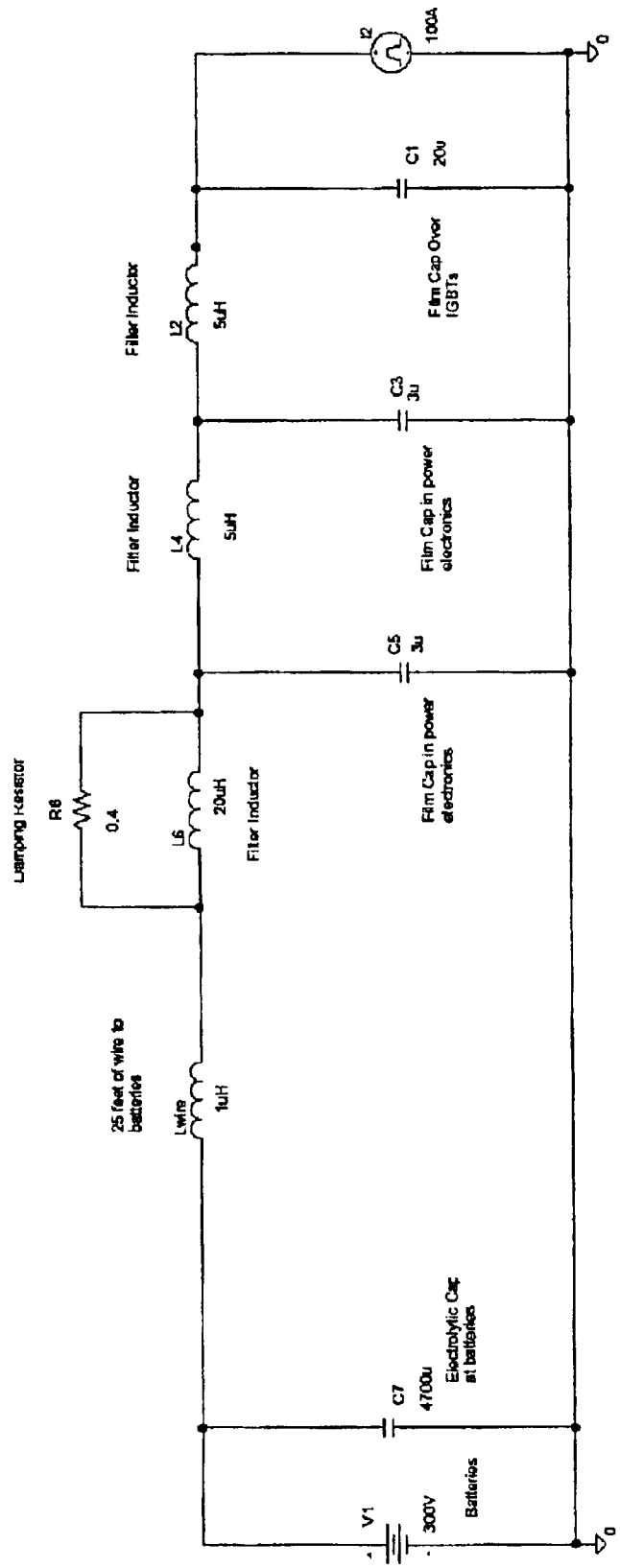
FIG. 6 is an exemplary design of the multi-section filter board.

In FIG. 6, the multi-section filter board components that meet the filter design specifications as shown in FIG. 5(a) and (b) are shown. Each inductor on the filter board is a 4.7 uH, 100 Amp inductor manufactured by Renco Electronics of Rockledge, Fla. The dominant inductor 218 includes four of these 4.7 uH inductors in series, to generate a total inductance of approximately 20 uH. Inductors 226 and 228 are each approximately 5.0 uH inductors. The parallel-connected resistor 216 is a 0.4 Ohm resistor. For power dissipation purposes, resistor 216 can be realized using multiple parallel-connected resistors. Capacitors 220, 222 and 224 include parallel-connected 1 uF, 400V capacitors manufactured by ITW Paktron of Bolingbrook, Ill. Three 1 uF parallel-connected capacitors make up the 3 uF capacitance of capacitors 220 and 222. The 20 uF capacitance of capacitor 224 is made up of twenty 1 uF parallel-connected capacitors.

Figure 7:
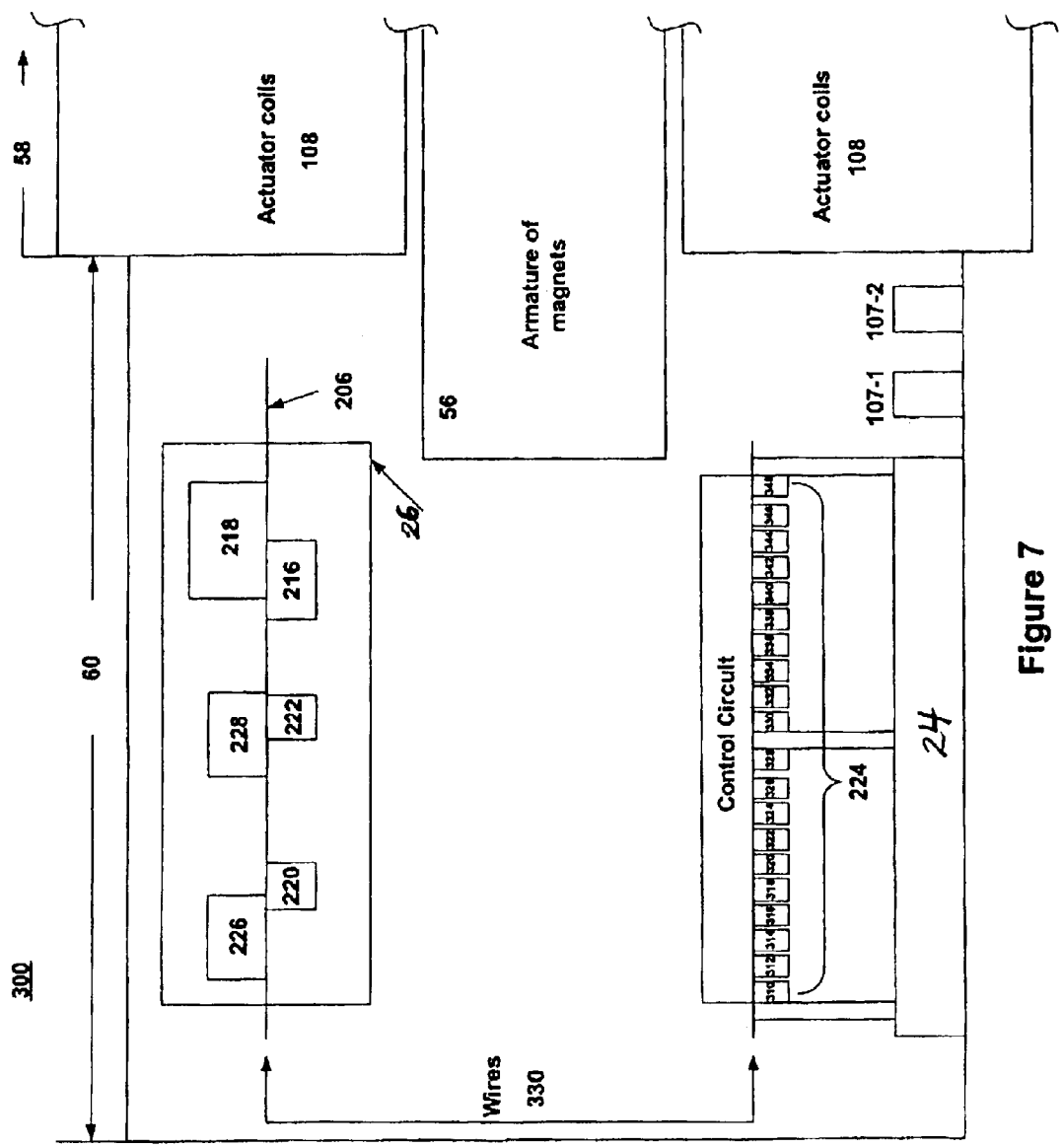
FIG. 7 is an exemplary layout of the integrated actuator.

In FIG. 7, an exemplary layout 300 of the actuator 12 of FIG. 1, which further shows one possible layout of the power-switching module 24 and the filter board 26 within the actuator housing, is shown. The filter board 26, located within the actuator top cap 18 as shown in FIG. 1, includes inductors 218, 226 and 228, capacitors 220 and 222, resistor 216, and connects to the external DC power supply via the power supply line 206. The filter board 26 further connects to the power-switching module 24 via the wires 330. The processor 102, current control circuit 104, and power-switching module 24 are also located within the actuator top cap 18 (labeled as "Control Circuit" in FIG. 7). The capacitors (310–348) providing the capacitance 224 of the third stage of the multi-stage L-C filter ladder are physically located immediately above the power-switching module 24. FIG. 7 also shows the two current sensors 107-1 and 107-2 that connect to the actuator coils 108 within the stator 16. The armature 14 having a number of magnets slides relative to the stator 16.

A number of embodiments of the invention have been described. Nevertheless, it will be understood that various modifications can be made without departing from the spirit and scope of the invention. Accordingly, other embodiments are within the scope of the following claims.

What is claimed is:

1. An electromechanical actuator comprising:
in a vehicle suspension system, a housing having a first section adapted to affix to a vehicle body and a second section adapted to affix to a vehicle wheel assembly suspended to the vehicle body, the first and second sections coupled to form a motor;
electronics including power-switching devices disposed within a chamber of the housing and adapted to receive electrical power and to direct power to the motor; and
a filter board comprising capacitors and inductors disposed within the chamber to suppress noise generated by the power-switching devices conducted to an external direct current (DC) power source.

2. The actuator of claim 1 in which the noise is conducted EMI emissions.

3. The actuator of claim 1 in which the chamber reduces radiated emissions from the power-switching devices.

4. The actuator of claim 1 in which the DC power source provides average voltage being substantially 325 volts.

5. The actuator of claim 1 in which the DC power source provides average voltage greater than 12 volts.

6. The actuator of claim 1 in which the DC power source provides average voltage greater than 42 volts.

7. The actuator of claim 1 in which the DC power source provides average voltage greater than 118 volts.

8. The actuator of claim 1 in which the DC power source provides peak current being substantially 100 amps.

9. The actuator of claim 1 in which the DC power source provides peak current greater than 75 amps.

10. The actuator of claim 1 in which the DC power source provides peak power being substantially equal to or greater than 30 KW.

11. The actuator of claim 1 in which the filter board is designed to fit within a package having a predetermined volume.

12. The actuator of claim 11 in which the predetermined volume is less than 2,100,000 cubic millimeters.

13. The actuator of claim 1 in which the capacitors are non-electrolytic capacitors comprising capacitor types of disk ceramics, monolithic/multilayer ceramics, polyester film, polycarbonate film, polypropylene film and metalized films.

14. The actuator of claim 1 in which the filter board distributes capacitance while minimizing line transients.

15. The actuator of claim 1 in which the filter board has an output impedance less than 1 ohm within the frequency range of 0 Hz to 2 kHz.

16. The actuator of claim 1 in which the filter board has an output impedance less than 1 ohm within the frequency range of 15 kHz to 5 MHz.

17. The actuator of claim 1 in which the filter board has an order greater than 2.

18. The actuator of claim 17 in which the filter board is a multi-section ladder filter.

19. The actuator of claim 1 in which the motor is a linear motor.

20. The actuator of claim 1 in which the motor is a rotary motor.

21. The actuator of claim 1 in which the power-switching devices are single-phase switching devices.

22. The actuator of claim 1 in which the power-switching devices are multi-phase switching devices.

23. The actuator of claim 22 in which the multi-phase switching devices are three-phase power-switching devices.

24. An electromechanical actuator system comprising:
  in a vehicle suspension system, a housing having a first section adapted to affix to a vehicle body and a second section adapted to affix to a vehicle wheel assembly suspended to the vehicle body, the first and second sections coupled to form a motor;
  electronics including power-switching devices disposed within a chamber of the housing and adapted to receive electrical power and to direct power to the motor; and
  a filter board disposed within the chamber, the filter board comprising a multisection ladder filter with dampening resistance designed to fit within a package having a predetermined volume.

25. The system of claim 24 in which the multi-section ladder filter comprises capacitors and inductors.

26. The system of claim 25 in which the multi-section ladder filter further comprises a dampening mechanism.

27. The system of claim 26 in which the dampening mechanism parallelly connects a resistance to at least one of the inductors.

28. The system of claim 26 in which the dampening mechanism serially connects a resistance to at least one of the capacitors.

29. The system of claim 26 in which the dampening mechanism serially connects a resistance to a dampening capacitor to construct a link, the link further parallelly connected to at least one of the capacitors.

30. The actuator of claim 24 in which the predetermined volume is less than 2,100,000 cubic millimeters.

31. The actuator of claim 24 in which the motor is a linear motor.

32. The actuator of claim 24 in which the motor is a rotary motor.

33. The actuator of claim 24 in which the power-switching devices are single-phase switching devices.

34. The actuator of claim 24 in which the power-switching devices are multi-phase switching devices.

35. The actuator of claim 34 in which the multi-phase switching devices are three-phase power-switching devices.

36. An electromechanical actuator comprising:
  in a vehicle suspension system, a housing having a first section adapted to affix to a vehicle body and a second section adapted to affix to a vehicle wheel assembly suspended to the vehicle body, the first and second sections coupled to form a motor;
  electronics including power-switching devices disposed within a chamber of the housing and adapted to receive electrical power and to direct power to the motor; and
  a filter board disposed within the chamber and positioned between the power-switching devices and an external DC power source, the filter board cutoff frequency designed to facilitate the power-switching devices to switch at a predetermined switching frequency.

37. The actuator of claim 36 in which the filter board comprises capacitors and inductors.

38. The actuator of claim 36 in which the predetermined switching frequency is greater than 15 kilohertz (kHz).

39. The actuator of claim 37 in which the capacitors and inductors provide a predetermined attenuation to the power-switching devices signal outputting to the external DC power source having frequency components greater than 500 kHz.

40. The actuator of claim 39 in which the predetermined attenuation is greater than 120 decibels (dB).

41. The actuator of claim 36 in which the motor is a linear motor.

42. The actuator of claim 36 in which the motor is a rotary motor.

43. The actuator of claim 36 in which the power-switching devices are single-phase switching devices.

44. The actuator of claim 36 in which the power-switching devices are multi-phase switching devices.

45. The actuator of claim 44 in which the multi-phase switching devices are three-phase power-switching devices.

46. An electromechanical actuator comprising:
  in a vehicle suspension system, a housing having a first section adapted to affix to a vehicle body and a second section adapted to affix to a vehicle wheel assembly suspended to the vehicle body, the first and second sections coupled to form a motor;
  electronics including power-switching devices disposed within a chamber of the housing and adapted to receive electrical power and to direct power to the motor; and
  a filter board disposed within the chamber and positioned between the power-switching devices and an external DC power source, the filter board having specific vibration tolerance characteristics.

47. The actuator of claim 46 in which the filter board comprises capacitors and inductors.

48. The actuator of claim 46 in which the specific vibration tolerance characteristics are Society of Automotive Engineers (SAE) J1211 vibration recommendations.

49. The actuator of claim 47 in which the capacitors are non-electrolytic capacitors including capacitor types of disk ceramics, monolithic/multilayer ceramics, polyester film, polycarbonate film, polypropylene film and metalized films.

50. The actuator of claim 49 in which the filter board distributes capacitance while minimizing line transients.

51. The actuator of claim 46 in which the motor is a linear motor.

52. The actuator of claim 46 in which the motor is a rotary motor.

53. The actuator of claim 46 in which the power-switching devices are single-phase switching devices.

54. The actuator of claim 46 in which the power-switching devices are multi-phase switching devices.

55. The actuator of claim 54 in which the multi-phase switching devices are three-phase power-switching devices.

56. An electromechanical actuator comprising:
in a vehicle suspension system, a housing having a first section adapted to affix to a vehicle body and a second section adapted to affix to a vehicle wheel assembly suspended to the vehicle body, the first and second sections coupled to form a motor;
electronics including power-switching devices disposed within a chamber of the housing and adapted to receive electrical power and to direct power to the motor; and
a filter board disposed within the chamber and positioned between the power-switching devices and an external DC power source, the filter board designed to meet specific EMI emission specifications.

57. The actuator of claim 56 in which the filter board comprises capacitors and inductors.

58. The actuator of claim 56 in which the specific EMI emissions specifications are Society of Automotive Engineers (SAE) J551 and J1113.

59. The actuator of claim 57 in which the capacitors are non-electrolytic capacitors including capacitor types of disk ceramics, monolithic/multilayer ceramics, polyester film, polycarbonate film, polypropylene film and metalized films.

60. The actuator of claim 56 in which the filter board distributes capacitance while minimizing line transients.

61. The actuator of claim 56 in which the motor is a linear motor.

62. The actuator of claim 56 in which the motor is a rotary motor.

63. The actuator of claim 56 in which the power-switching devices are single-phase switching devices.

64. The actuator of claim 56 in which the power-switching devices are multi-phase switching devices.

65. The actuator of claim 64 in which the multi-phase switching devices are three-phase power-switching devices.

66. An electromechanical actuator comprising:
in a vehicle suspension system, a housing having a first section adapted to affix to a vehicle body and a second section adapted to affix to a vehicle wheel assembly suspended to the vehicle body, the first and second sections coupled to form a motor;
electronics including power-switching devices disposed within a chamber of the housing and adapted to receive electrical power and to direct power to the motor; and
a filter board with a power density at least 0.0143 watts/cubic millimeter disposed within the chamber to suppress noise generated by the power-switching devices conducted to an external DC power source.

67. The actuator of claim 66 in which the noise is conducted EMI emissions.

68. The actuator of claim 66 in which the filter board comprises capacitors and inductors design to fit within a package having a predetermined volume.

69. The actuator of claim 68 in which the predetermined volume is less than 50 cubic inches.

70. The actuator of claim 66 in which the filter board comprises capacitors and inductors.

71. The actuator of claim 70 in which the capacitors are non-electrolytic capacitors including capacitor types of disk ceramics, monolithic/multilayer ceramics, polyester film, polycarbonate film, polypropylene film and metalized films.

72. The actuator of claim 66 in which the filter board distributes capacitance while minimizing line transients.

73. The actuator of claim 66 in which the filter board has an output impedance lower than an input impedance of the plurality of power-switching devices.

74. The actuator of claim 66 in which the motor is a linear motor.

75. The actuator of claim 66 in which the motor is a rotary motor.

76. The actuator of claim 66 in which the power-switching devices are single-phase switching devices.

77. The actuator of claim 66 in which the power-switching devices are multi-phase switching devices.

78. The actuator of claim 77 in which the multi-phase switching devices are three-phase power-switching devices.

79. An electromechanical actuator comprising:
in a vehicle suspension system, a housing having a first section adapted to affix to a vehicle body and a second section adapted to affix to a vehicle wheel assembly suspended to the vehicle body, the first and second sections coupled to form a motor;
electronics including power-switching devices disposed within a chamber of the housing and adapted to receive electrical power and to direct power to the motor; and
a filter board having a mass density substantially equal to 0.0000007 kg per cubic millimeter disposed within the chamber to suppress noise generated by the power-switching devices to an external DC power source.

80. The actuator of claim 79 in which the noise is conducted EMI emissions.

81. The actuator of claim 79 in which the filter board comprises capacitors and inductors design to fit within a small package.

82. The actuator of claim 79 in which the filter board comprises capacitors and inductors.

83. The actuator of claim 82 in which the capacitors are non-electrolytic capacitors including capacitor types of disk ceramics, monolithic/multilayer ceramics, polyester film, polycarbonate film, polypropylene film and metalized films.

84. The actuator of claim 79 in which the filter board distributes capacitance while minimizing line transients.

85. An electromechanical actuator system comprising:
in a vehicle suspension system, a housing having a first section adapted to affix to a vehicle body and a second section adapted to affix to a vehicle wheel assembly suspended to the vehicle body, the first and second sections coupled to form a motor;
electronics including power-switching devices disposed within a chamber of the housing and adapted to receive electrical power from an external power supply via a power supply line and to direct power to the motor; and
a filter board disposed within the chamber, the filter board comprising a large inductor positioned between the external power supply and the power-switching devices via the power supply line.

86. The system of claim 85 in which the large inductor is series connected to the power supply line, wherein said large inductor has dominant inductance relative to the power supply line.

87. The system of claim 85 in which the filter board further comprises a dampening mechanism which parallelly connects a dampening resistance to the large inductor.

88. The system of claim 86 in which the large inductor minimizes the negative effects of the power line inductance to allow the power-switching devices being able to be located freely within the actuator.

89. The actuator of claim 85 in which the motor is a linear motor.

90. The actuator of claim 85 in which the motor is a rotary motor.

91. The actuator of claim 85 in which the power-switching devices are single-phase switching devices.

92. The actuator of claim 85 in which the power-switching devices are multi-phase switching devices.

93. The actuator of claim 92 in which the multi-phase switching devices are three-phase power-switching devices.

* * * * *